(12) United States Patent
Cha

(10) Patent No.: US 11,009,555 B2
(45) Date of Patent: May 18, 2021

(54) BATTERY MANAGEMENT SYSTEM AND METHOD FOR OPTIMIZING INTERNAL RESISTANCE OF BATTERY

(71) Applicant: LG CHEM, LTD., Seoul (KR)

(72) Inventor: Sun-Young Cha, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/500,636

(22) PCT Filed: Sep. 5, 2018

(86) PCT No.: PCT/KR2018/010371
§ 371 (c)(1),
(2) Date: Oct. 3, 2019

(87) PCT Pub. No.: WO2019/088440
PCT Pub. Date: May 9, 2019

(65) Prior Publication Data
US 2020/0096573 A1     Mar. 26, 2020

(30) Foreign Application Priority Data
Nov. 3, 2017    (KR) .................. 10-2017-0146221

(51) Int. Cl.
*G01R 31/389*     (2019.01)
*H01M 10/42*     (2006.01)
(Continued)

(52) U.S. Cl.
CPC ......... *G01R 31/389* (2019.01); *G01R 31/367* (2019.01); *H01M 10/425* (2013.01); *H01M 10/48* (2013.01); *H01M 2010/4271* (2013.01)

(58) Field of Classification Search
CPC .............. G01R 31/3651; G01R 31/389; G01R 31/367; G01R 27/02; H01M 10/625;
(Continued)

(56) References Cited

U.S. PATENT DOCUMENTS

| 2006/0087291 A1 | 4/2006 | Yamauchi |
| 2008/0074082 A1* | 3/2008 | Tae .................. B60L 58/15 |
| | | 320/136 |

(Continued)

FOREIGN PATENT DOCUMENTS

| JP | 2006-338944 A | 12/2006 |
| JP | 2010-169609 A | 8/2010 |

(Continued)

OTHER PUBLICATIONS

International Search Report dated Dec. 19, 2018, issued in corresponding International Patent Application No. PCT/KR2018/010371.

(Continued)

*Primary Examiner* — Melissa J Koval
*Assistant Examiner* — Trung Q Nguyen
(74) *Attorney, Agent, or Firm* — Morgan, Lewis & Bockius LLP

(57) ABSTRACT

Provided are a battery management system and method for optimizing an internal resistance of a battery. The battery management system includes: a current measurement unit configured to measure a discharging current of the battery; a memory configured to store a plurality of voltage-current characteristic profiles; and a control unit operatively connected to the current measurement unit and the memory and configured to determine a reference profile from the plurality of voltage-current characteristic profiles based on a state of charge and a temperature of the battery. The reference profile includes a start point, an end point, and a plurality of intermediate points positioned between the start point and the end point. The control unit is further configured to: determine an internal resistance of the battery based on the start point and the end point; set one of the plurality of intermediate points as a reference point; determine a refer- (Continued)

ence resistance smaller than the internal resistance based on the reference point and the end point; and determine an optimum resistance larger than the internal resistance based on the discharging current, the internal resistance, the reference resistance, and a predetermined discharge upper limit current.

8 Claims, 4 Drawing Sheets

(51) Int. Cl.
  *G01R 31/367* (2019.01)
  *H01M 10/48* (2006.01)
(58) Field of Classification Search
  CPC .... H01M 10/425; H01M 10/48; H01M 10/44; H01M 2010/4271; H02J 7/04
  USPC ... 324/207.13–207.15, 200, 86, 167, 207.25, 324/425–434, 654, 76.75, 76.11, 500, 324/750.16, 220
  See application file for complete search history.

(56) References Cited

U.S. PATENT DOCUMENTS

| | | | | |
|---|---|---|---|---|
| 2012/0004875 | A1* | 1/2012 | Maeda | H01M 10/48 702/63 |
| 2014/0111164 | A1 | 4/2014 | Ohkawa et al. | |
| 2015/0032394 | A1* | 1/2015 | Kimura | G01R 31/367 702/63 |
| 2015/0280294 | A1 | 10/2015 | Shin et al. | |
| 2017/0059662 | A1 | 3/2017 | Cha et al. | |
| 2017/0123011 | A1 | 5/2017 | Cha et al. | |
| 2017/0222450 | A1* | 8/2017 | Lee | H02J 7/00 |
| 2018/0069272 | A1 | 3/2018 | Seo et al. | |

FOREIGN PATENT DOCUMENTS

| | | |
|---|---|---|
| JP | 2012-013554 A | 1/2012 |
| JP | 2014-025738 A | 2/2014 |
| KR | 10-2006-0052273 A | 5/2006 |
| KR | 10-2014-0123838 A | 10/2014 |
| KR | 10-2016-0039364 A | 4/2016 |
| KR | 10-2016-0094882 A | 8/2016 |
| KR | 10-2016-0103396 A | 9/2016 |
| KR | 10-2016-0142336 A | 12/2016 |
| KR | 10-2017-0022758 A | 3/2017 |
| WO | 2012/169063 A | 12/2012 |

OTHER PUBLICATIONS

Office Action dated Aug. 20, 2020, issued in corresponding Korean Patent Application No. 10-2017-0146221.

Office Action dated Sep. 8, 2020, issued in corresponding Japanese Patent Application No. 2019-547398.

* cited by examiner

BATTERY MANAGEMENT SYSTEM AND METHOD FOR OPTIMIZING INTERNAL RESISTANCE OF BATTERY

TECHNICAL FIELD

The present disclosure relates to a battery management system and method for optimizing an internal resistance of a battery.

The present application claims priority to Korean Patent Application No. 10-2017-0146221 filed on Nov. 3, 2017 in the Republic of Korea, the disclosures of which are incorporated herein by reference.

BACKGROUND ART

Recently, as the demand for portable electronic products such as notebook computers, video cameras, and mobile phones is rapidly increasing and the development of electric vehicles, energy storage batteries, robots, satellites, and the like is being regularized, studies on high performance batteries capable of repeated charge and discharge have been actively conducted.

Currently available batteries include nickel-cadmium batteries, nickel-hydrogen batteries, nickel-zinc batteries, and lithium batteries. Of these, lithium batteries have almost no memory effect as compared with nickel-based batteries, and are thus free for charge and discharge and have a very low self-discharge rate and a high energy density. Due to these advantages, lithium batteries have attracted attention.

Since the life of the battery is reduced when the battery is over-discharged, it is necessary to adaptively adjust the output power of the battery according to the state of the battery while discharging the battery. In order to adjust the output power of the battery, the process of determining the internal resistance of the battery must be preceded. To this end, a conventional technique as disclosed in Patent Literature 1 records voltage data and current data indicating voltage-current characteristics of a battery with respect to a specific state of charge and a specific temperature through a preliminary experiment and calculates an internal resistance corresponding to the specific state of charge and the specific temperature by linearizing the voltage-current characteristics by using a data fitting algorithm such as a least square method.

However, even when the state of charge and the temperature of the battery are constant, the internal resistance of the battery may change depending on a magnitude of a discharging current. Therefore, it is difficult to effectively prevent over-discharge of the battery by the technique disclosed in Patent Literature 1 or the like.

(Patent Literature 1) Korean Patent Application Publication No. 10-2006-0052273 (published on May 19, 2006).

DISCLOSURE

Technical Problem

The present disclosure is designed to solve the problems of the related art, and therefore the present disclosure is directed to providing a battery management system and method for optimizing an internal resistance of a battery, which is defined by a voltage-current characteristic profile corresponding to a specific state of charge and a specific temperature, based on a discharging current of a battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management system for optimizing an internal resistance of a battery, including: a current measurement unit configured to measure a discharging current of the battery; a memory configured to store a plurality of voltage-current characteristic profiles; and a control unit operatively connected to the current measurement unit and the memory and configured to determine a reference profile from the plurality of voltage-current characteristic profiles based on a state of charge and a temperature of the battery. The reference profile includes a start point, an end point, and a plurality of intermediate points positioned between the start point and the end point, The control unit is further configured to: determine an internal resistance of the battery based on the start point and the end point; set one of the plurality of intermediate points as a reference point; determine a reference resistance smaller than the internal resistance based on the reference point and the end point; and determine an optimum resistance larger than the internal resistance based on the discharging current, the internal resistance, the reference resistance, and a predetermined discharge upper limit current.

In addition, the control unit may be further configured to determine the internal resistance by dividing a difference between a voltage of the start point and a voltage of the end point by a current of the end point. The voltage of the start point may indicate an open circuit voltage of the battery corresponding to the state of charge and the temperature of the battery.

In addition, the current of the end point may be equal to the discharge upper limit current.

In addition, the control unit may be further configured to determine the reference resistance based on a voltage of the reference point, a current of the reference point, a voltage of the end point, and a current of the end point.

In addition, the control unit may be further configured to determine the reference resistance by using Equation 1:

$$R_{ref} = \frac{V_{ref} - V_{end}}{I_{ref} - I_{end}}$$

In Equation 1, $I_{ref}$ is the current of the reference point, $V_{ref}$ is the voltage of the reference point, $I_{end}$ is the current of the end point, $V_{end}$ is the voltage of the end point, and $R_{ref}$ is the reference resistance.

In addition, the control unit may be further configured to determine the optimum resistance by using Equation 2:

$$R_{opt} = \frac{V_{ocv} - \{V_{ocv} - (R_{int} - R_{ref})I_{end} - R_{ref}I_{dis}\}}{I_{dis}} = \frac{(R_{int} - R_{ref})I_{end}}{I_{dis}} + R_{ref}$$

In Equation 2, $R_{int}$ is the internal resistance, $I_{dis}$ is the discharging current, and $R_{opt}$ is the optimum resistance.

In addition, the control unit may be further configured to determine, as the reference point, an intermediate point closest to the end point among the plurality of intermediate points.

In another aspect of the present disclosure, there is also provided a battery pack including the battery management system.

In another aspect of the present disclosure, there is also provided a method of optimizing an internal resistance of a battery, including: determining a reference profile from a plurality of voltage-current characteristic profiles based on a state of charge and a temperature of the battery, the reference profile including a start point, an end point, and a plurality of intermediate points positioned between the start point and the end point, determining an internal resistance of the battery based on the start point and the end point; setting one of the plurality of intermediate points as a reference point; determining a reference resistance smaller than the internal resistance based on the reference point and the end point; and determining an optimum resistance larger than the internal resistance based on a discharging current, the internal resistance, the reference resistance, and a predetermined discharge upper limit current of the battery.

Advantageous Effects

According to at least one of the embodiments of the present disclosure, an internal resistance of a battery, which is defined by a voltage-current characteristic profile corresponding to a specific state of charge and a specific temperature, may be optimized based on a discharging current of a battery.

According to at least one of the embodiments of the present disclosure, the optimized internal resistance is used to adjust the output power of the battery, thereby effectively preventing over-discharge of the battery as compared with the related art.

The effects of the present disclosure are not limited to the above-described effects, and other effects not described herein may be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

Figure 1:
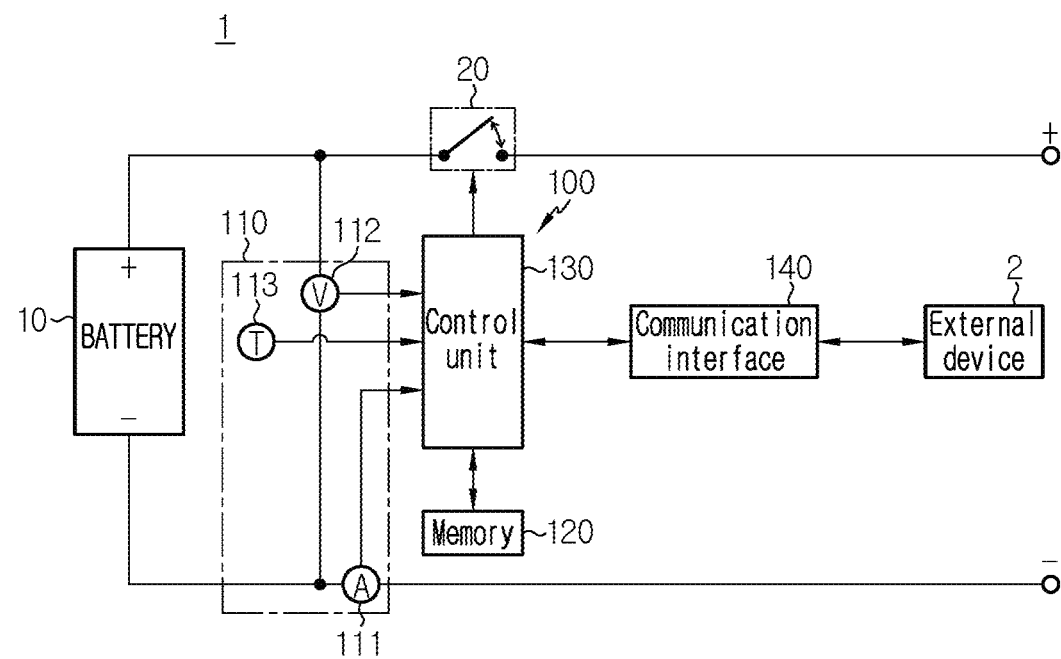
FIG. 1 is a diagram illustrating a functional configuration of a battery pack according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, it should be understood that various equivalents and alternatives can be made at the time of filing the present disclosure since the descriptions of the specification and the features shown in the drawings are no other than preferred embodiments without reflecting all the technical ideas of the present disclosure.

However, in the following descriptions and the accompanying drawings, descriptions of well-known functions or constructions will be omitted if they are considered to unnecessarily obscure the gist of the present disclosure.

It should be understood that terms including ordinals, such as first, second, etc., are used for the purpose of distinguishing one of various components from the others, and are not used to limit the components by such terms.

It should be understood that terms such as "comprise", "include", and "have", when used herein, specify the presence of stated elements, but do not preclude the presence or addition of one or more other elements. In addition, the terms "control unit" as used herein represent a unit for processing at least one function or operation, which may be implemented by hardware, software, or a combination thereof.

It should be understood that when a region is referred to as being "connected to" or "coupled to" another region, it may be "directly" connected or coupled to the other region, or may be "indirectly" connected or coupled to the other region, with intervening regions being disposed therebetween.

FIG. 1 is a diagram illustrating a functional configuration of a battery pack 1 according to an embodiment of the present disclosure.

Referring to FIG. 1, the battery pack 1 includes a battery 10, a switch 20, and a battery management system 100. The switch 20 is configured to be turned on and off in response to a switching signal (for example, a pulse width modulation signal) from the battery management system 100 so as to adjust a magnitude of a charging current and/or a discharging current of the battery 10. Hereinafter, it is assumed that the discharging current is measured as a positive value, and the charging current is measured as a negative value.

The battery management system 100 is electrically connectable to the battery 10 and is configured to monitor and control the state of the battery 10. The battery management system 100 includes a sensing unit 110, a memory 120, a control unit 130, and a communication interface 140.

The sensing unit 110 includes a current measurement unit 111. The current measurement unit 111 measures a current of the battery 10 at each predetermined cycle and transmits a current signal indicating the measured current to the control unit 130. The current measured while discharging the battery 10 may be referred to as a "discharging current", and the current measured while charging the battery 10 may be referred to as a "charging current". The control unit 130 may convert an analog current signal transmitted from the current measurement unit 111 into digital current data.

The sensing unit 110 may further include a voltage measurement unit 112. The voltage measurement unit 112 measures a voltage of the battery 10 at each predetermined cycle and transmits a voltage signal indicating the measured voltage to the control unit 130. The control unit 130 may convert an analog voltage signal transmitted from the voltage measurement unit 112 into digital voltage data.

The sensing unit 110 may further include a temperature measurement unit 113. The temperature measurement unit 113 measures a temperature of the battery 10 at each predetermined cycle and transmits a temperature signal indicating the measured temperature to the control unit 130. The control unit 130 may convert an analog temperature signal transmitted from the temperature measurement unit 113 into digital temperature data. The current measurement unit 111, the voltage measurement unit 112, and the temperature measurement unit 113 may operate in synchronization with one another.

The memory 120 is configured to store a plurality of voltage-current characteristic profiles. Each of the voltage-current characteristic profiles includes a start point, an end point, and a plurality of intermediate points. The start point indicates an open circuit voltage (OCV) measured when a discharging current is 0 A. The end point indicates a voltage measured at the time of pulse discharge by the same constant current as a discharge upper limit current. Each of the intermediate points indicates a voltage measured at the time of pulse discharge by a constant current that is larger than 0 A and less than the discharge upper limit current.

Each of the voltage-current characteristic profiles may be associated with a specific state of charge (SOC) and a specific temperature. For example, any one of the plurality of voltage-current characteristic profiles may be associated with an SOC of 80% and a temperature of −20° C., and another may be associated with an SOC of 80% and a temperature of 25° C. It will be apparent to those skilled in the art that various voltage-current characteristic profiles associated with different SOCs and temperatures may be stored in the memory 120.

The memory 120 may additionally store data, commands, and software required for the overall operation of the battery management system 100. The memory 120 may include at least one storage medium selected from flash memory, hard disk, solid state disk (SSD), silicon disk drive (SDD), multimedia card micro type memory, random access memory (RAM), static random access memory (SRAM), read-only memory (ROM), electrically erasable programmable read-only memory (EEPROM), and programmable read-only memory (PROM).

The control unit 130 is operatively coupled to the sensing unit 110, the memory 120, and the communication interface 140. The control unit 130 may estimate the SOC of the battery 10 based on the current signal, the voltage signal, and/or the temperature signal, which is transmitted from the sensing unit 110. The control unit 130 may update the SOC of the battery 10 at each predetermined cycle based on the current signal by using ampere counting. Alternatively, the control unit 130 may update the SOC of the battery 10 at each predetermined cycle by using a method well known in the art, such as an extended Kalman filter, in addition to the ampere counting.

The control unit 130 may determine the temperature of the battery 10 based on the temperature signal transmitted from the sensing unit 110, and then determine a reference profile from a plurality of voltage-current characteristic profiles based on the estimated SOC and the determined temperature. The reference profile may be any one voltage-current characteristic profile corresponding to the estimated SOC and the determined temperature among the plurality of voltage-current characteristic profiles.

According to hardware implementation, the control unit 130 may be implemented by using at least one selected from application specific integrated circuits (ASICs), digital signal processors (DSPs), digital signal processing devices (DSPDs), programmable logic devices (PLDs), field programmable gate arrays (FPGAs), microprocessors, and electrical units for performing other functions.

The communication interface 140 may be communicably connected to an external device 2 such as an ECU of an electric vehicle. The communication interface 140 may receive a command message from the external device 2 and provide the received command message to the control unit 130. The command message may be a message requesting activation of a specific function of the battery management system 100. The communication interface 140 may transmit a notification message from the control unit 130 to the external device 2. The notification message may be a message for notifying the external device 2 of the result of the function executed by the control unit 130.

Figure 2:
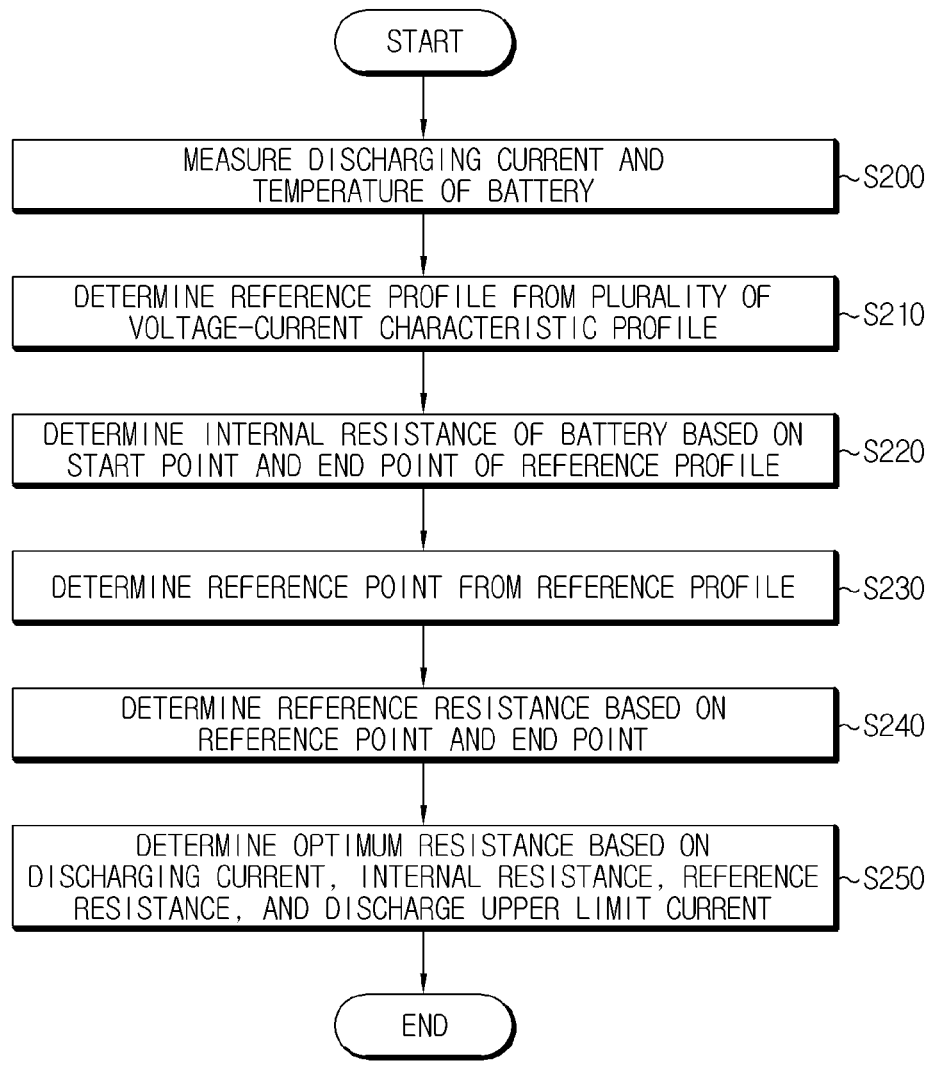
FIG. 2 is a flowchart of a method for optimizing an internal resistance of a battery, according to an embodiment of the present disclosure.
Figure 3:
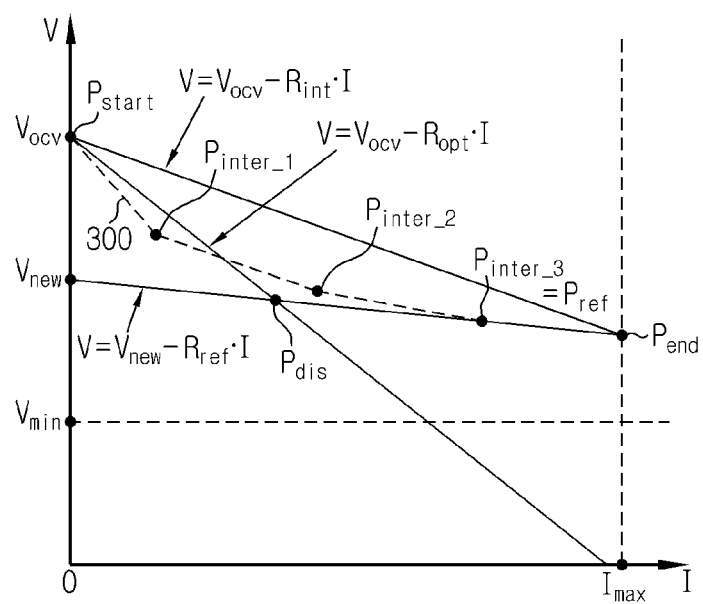
FIG. 3 is a graph showing an exemplary voltage-current characteristic profile referred to in describing the method of FIG. 2.

FIG. 2 is a flowchart of a method for optimizing an internal resistance of a battery, according to an embodiment of the present disclosure, and FIG. 3 is a graph showing an exemplary voltage-current characteristic profile referred to in describing the method of FIG. 2.

Referring to FIG. 2, in step S200, the control unit 130 measures a discharging current $I_{dis}$ and a temperature of the battery 10 by using the sensing unit 110.

In step S210, the control unit 130 determines a reference profile from a plurality of voltage-current characteristic profiles stored in the memory 120, based on an SOC (for example, SOC 80%) of the battery 10 and the measured temperature (for example, 25° C.). In other words, the reference profile determined through step S210 is any one of the plurality of voltage-current characteristic profiles corresponding to the SOC (for example, SOC 80%) and the temperature (for example, 25° C.) of the battery 10. In order to determine the reference profile, prior to the execution of step S210, the control unit 130 may update the SOC and the temperature of the battery 10 to the latest values, respectively, based on the current signal, the voltage signal, and/or the temperature signal from the sensing unit 110

A voltage-current characteristic profile 300 illustrated in FIG. 3 is an example of the reference profile determined in step S210, and may be associated with an SOC of 80% and a temperature of 25° C. among the plurality of voltage-current characteristic profiles 300 stored in the memory 120.

It is assumed that the voltage-current characteristic profile 300 includes a total of five points, that is, a start point $P_{start}$, intermediate points $P_{inter\_1}$, $P_{inter\_2}$, and $P_{inter\_3}$, and an end point $P_{end}$. As described above, the three intermediate points $P_{inter\_1}$, $P_{inter\_2}$, and $P_{inter\_3}$ are positioned between the start point $P_{start}$ and the end point $P_{end}$.

The voltage-current characteristic profile 300 may be defined by terminal voltages $V_{start}$, $V_{inter\_1}$, $V_{inter\_2}$, $V_{inter\_3}$, and $V_{end}$ of other batteries measured at the time when the other batteries are repeatedly pulse-discharged with constant currents $I_{start}$, $I_{inter\_1}$, $I_{inter\_2}$, $I_{inter\_3}$, and $I_{end}$ of different magnitudes for a predetermined time (for example, 10 sec) in a condition that the SOCs and temperatures of the other batteries manufactured to have the same electrochemical characteristics as those of the battery 10 are constantly maintained at specific values. For example, $V_{inter\_1}$ is a voltage measured when the other batteries are discharged with $I_{inter\_1}$ for 10 seconds in a condition that the SOCs and temperatures of the other batteries are 80% and 25° C., $V_{inter\_2}$ is a voltage measured when the other batteries are discharged with $I_{inter\_2}$ for 10 seconds in a condition that the SOCs and temperatures of the other batteries are 80% and 25° C., $V_{inter\_3}$ is a voltage measured when the other batteries are discharged with $I_{inter\_3}$ for 10 seconds in a condition that the SOCs and temperatures of the other batteries are 80% and 25° C., and $V_{end}$ is a voltage measured when the other batteries are discharged with Iend for 10 seconds in a condition that the SOCs and temperatures of the other batteries are 80% and 25° C.

It will be apparent that the voltage-current characteristic profile 300 may include two or less intermediate points or four or more intermediate points different from the intermediate points illustrated in FIG. 3.

Each point defining the voltage-current characteristic profile 300 is represented by a pair of a single voltage and a single current. Specifically, the start point $P_{start}$ may be represented by $P_{start}=(V_{start}, I_{start})$, the end point $P_{end}$ may be represented by $P_{end}=(V_{end}, I_{end})$, the intermediate point $P_{inter\_1}$ may be represented by $P_{inter\_1}=(V_{inter\_1}, I_{inter\_1})$, the intermediate point $P_{inter\_2}$ may be represented by $P_{inter\_2}=(V_{inter\_2}, I_{inter\_2})$, and the intermediate point $P_{inter\_1}$ may be represented by $P_{inter\_3}=(V_{inter\_3}, I_{inter\_3})$. $V_{start}$ is a voltage detected when the discharging current is $I_{start}$, $V_{inter\_1}$ is a voltage detected when the discharging current is $I_{inter\_1}$, $V_{inter\_2}$ is a voltage detected when the discharging current is $I_{inter\_2}$, $V_{inter\_3}$ is a voltage detected when the discharging current is $I_{inter\_3}$, and $V_{end}$ is a voltage detected when the discharging current is $I_{end}$.

$V_{ocv}=V_{start}>V_{inter\_1}>V_{inter\_2}>V_{inter\_3}>V_{end}$, and $I_{start}<I_{inter\_1}<I_{inter\_2}<I_{inter\_3}<I_{end}=I_{max}$. $V_{ocv}$ indicates the OCV of the battery 10 at an SOC of 80% and a temperature of 25° C. $I_{max}$ indicates the discharge upper limit current and may be a value given for preventing the battery 10 from being damaged by an overcurrent. The control unit 130 may control the discharging current of the battery 10 so that a current exceeding the discharge upper limit current $I_{max}$ does not flow through the battery 10.

In step S220, the control unit 130 determines the internal resistance $R_{int}$ of the battery 10 based on the start point $P_{start}$ and the end point $P_{end}$. Specifically, a straight line passing through the start point $P_{start}$ and the end point $P_{end}$ may be expressed by Equation 1 below.

$$V=V_{ocv}-R_{int}I \qquad \text{<Equation 1>}$$

The internal resistance $R_{int}$ is a solution of simultaneous equations in which the voltages and currents of the start point $P_{start}$ and the end point $P_{end}$ are respectively substituted into V and I of Equation 1, and the control unit 130 may determine the internal resistance $R_{int}$ by using Equation 2 below.

$$R_{int} = \frac{V_{start} - V_{end}}{I_{start} - I_{end}} \qquad \text{< Equation 2 >}$$

Alternatively, the internal resistance $R_{int}$ may be a value prestored in the memory 120 for the voltage-current characteristic profile 300. In this case, the control unit 130 may read the internal resistance $R_{int}$ from the memory 120 instead of executing step S220.

In step S230, the control unit 130 determines a reference point $P_{ref}$ from the reference profile 300. The reference point $P_{ref}$ may be any one of the intermediate points $P_{inter\_1}$, $P_{inter\_2}$, and $P_{inter\_3}$ included in the voltage-current characteristic profile 300. When k=1, 2, and 3, the control unit 130 calculates a slope $$\frac{V_{inter\_k} - V_{end}}{I_{inter\_k} - I_{end}}$$

of a straight line passing through the intermediate point $P_{inter\_k}$ and the end point $P_{end}$, and set, as the reference point $P_{ref}$, one intermediate point at which the absolute value of the calculated slope becomes the smallest. In the case of $$\left|\frac{V_{inter\_1} - V_{end}}{I_{inter\_1} - I_{end}}\right| > \left|\frac{V_{inter\_2} - V_{end}}{I_{inter\_2} - I_{end}}\right| > \left|\frac{V_{inter\_3} - V_{end}}{I_{inter\_3} - I_{end}}\right|$$

as in the voltage-current characteristic profile 300 of FIG. 3, the control unit 130 may set $P_{inter\_3}$ as the reference point $P_{ref}$.

Alternatively, the control unit 130 may set, as the reference point $P_{ref}$, the intermediate point $P_{inter\_3}$ closest to the end point $P_{end}$ among the intermediate points $P_{inter\_1}$, $P_{inter\_2}$, and $P_{inter\_3}$.

In step S240, the control unit 130 determines the reference resistance $R_{ref}$ smaller than the internal resistance $R_{int}$ based on the reference point $P_{ref}$ and the end point $P_{end}$.

Specifically, a straight line passing through the reference point $P_{ref}$ and the end point $P_{end}$ may be expressed by Equation 3 below.

$$V=V_{new}-R_{ref}I< \qquad \text{Equation 3>}$$

In Equation 3, $V_{new}$ is a voltage of a point at which a straight line having a slope of $-R_{ref}$ and passing through the reference point $P_{ref}$ meets a V axis as illustrated in FIG. 3.

The voltage $V_{new}$ and the reference resistance $R_{ref}$ are two solutions of simultaneous equations in which the voltages and currents of the reference point $P_{ref}$ and the end point $P_{end}$ are respectively substituted into V and I of Equation 3, and the control unit 130 may determine the reference resistance $R_{ref}$ by using Equation 4 below.

$$R_{ref} = \frac{V_{ref} - V_{end}}{I_{ref} - I_{end}} \qquad \text{< Equation 4 >}$$

As in the above example, when the reference point $P_{ref}$ is the intermediate point $P_{inter\_3}$, $V_{ref}=V_{inter\_3}$ and $I_{ref}=I_{inter\_3}$ in Equation 4.

Alternatively, the reference resistance $R_{ref}$ may be a value previously stored in the memory 120 for the voltage-current characteristic profile 300. In this case, the control unit 130 may read the reference resistance $R_{ref}$ from the memory 120 instead of executing steps S230 and S240.

Referring to FIG. 3, since the intermediate points $P_{inter\_1}$, $P_{inter\_2}$, and $P_{inter\_3}$ are positioned below the straight line passing the start point $P_{start}$ and the end point $P_{end}$, it will be readily understood by those skilled in the art that the reference resistance $R_{ref}$ is less than the internal resistance $R_{int}$.

In step S250, the control unit 130 determines an optimum resistance $R_{opt}$ based on the measured discharging current $I_{dis}$, the internal resistance $R_{int}$, the reference resistance $R_{ref}$, and the discharge upper limit current $I_{max}$. In this case, the optimum resistance $R_{opt}$ is larger than the internal resistance $R_{int}$. If the optimum resistance $R_{opt}$ determined in step S250 is equal to or smaller than the internal resistance $R_{int}$, the control unit 130 may determine that an error has occurred during execution of at least one of steps S200 to S250 and may return to step S210.

If the voltage $V_{end}$ and the current $I_{end}$ of the end point $P_{end}$ are respectively substituted into V and I of Equation 1, it may be expressed by Equation 5 below.

$$V_{end}=V_{ocv}-R_{int}I_{end} \qquad \text{<Equation 5>}$$

If the voltage $V_{end}$ and the current $I_{end}$ of the end point $P_{end}$ are respectively substituted into V and I of Equation 3, it may be expressed by Equation 6 below.

$$V_{end} = V_{new} - R_{ref}I_{end} \qquad \text{<Equation 6>}$$

If Equation 6 is summarized with respect to $V_{new}$, it may be expressed by Equation 7 below.

$$V_{new} = V_{end} + R_{ref}I_{end} \qquad \text{<Equation 7>}$$

If $V_{ocv} - I_{end}R_{int}$ of Equation 5 is substituted into in $V_{end}$ of Equation 7, it may be expressed by Equation 8 below.

$$V_{new} = (V_{ocv} - R_{int}I_{end}) + I_{end}R_{ref} = V_{ocv} - (R_{int} - R_{ref})I_{end} \qquad \text{<Equation 8>}$$

In FIG. 3, $P_{dis}$ is a discharge point positioned on a straight line passing the reference point $P_{ref}$ and the end point $P_{end}$. The current of the discharge point $P_{dis}$ is the discharging current $I_{dis}$. Therefore, from Equation 3, the voltage $V_{dis}$ of the discharge point $P_{dis}$ may be expressed by Equation 9 below.

$$V_{dis} = V_{new} - R_{ref}I_{dis} \qquad \text{<Equation 9>}$$

when '$V_{ocv} - (R_{int} - R_{ref})I_{end}$' of Equation 8 is substituted into $V_{new}$ of Equation 9, it may be expressed by Equation 10 below.

$$V_{dis} = V_{ocv} - (R_{int} - R_{ref})I_{end} - R_{ref}I_{dis} \qquad \text{<Equation 10>}$$

A straight line passing through the start point $P_{start}$ and the discharge point $P_{dis}$ may be expressed by Equation 11 below.

$$V = V_{ocv} - R_{opt}I \qquad \text{<Equation 11>}$$

The optimum resistance $R_{opt}$ indicates a slope of a straight line passing between the start point $P_{start}$ and the discharge point $P_{dis}$. If the voltage $V_{dis}$ and the current Isis of the discharge point $P_{dis}$ are respectively substituted into V and I of Equation 11, it may be expressed by Equation 12 below.

$$R_{opt} = \frac{V_{ocv} - V_{dis}}{I_{dis}} \qquad \text{< Equation 12 >}$$

when '$V_{ocv} - (R_{int} - R_{ref})I_{end} - R_{ref}I_{dis}$' of Equation 10 is substituted into $V_{dis}$ of Equation 12, it may be expressed by Equation 13 below.

$$R_{opt} = \frac{V_{ocv} - \{V_{ocv} - (R_{int} - R_{ref})I_{end} - R_{ref}I_{dis}\}}{I_{dis}} = \frac{(R_{int} - R_{ref})I_{end}}{I_{dis}} + R_{ref} \qquad \text{< Equation 13 >}$$

The control unit 130 may determine the optimum resistance $R_{opt}$ by using Equation 13. That is, the control unit 130 may determine the optimum resistance $R_{opt}$ by substituting $R_{int}$, $R_{ref}$, Isis, and $I_{end}$ obtained in steps S210 to S240 into Equation 13.

As described above, since $R_{int}$ is larger than $R_{ref}$, $R_{opt}$ is larger than $R_{int}$. Therefore, when the output power is controlled while discharging the battery 10 by using $R_{opt}$, the over-discharge of the battery 10 may be effectively prevented, as compared with the method of controlling the output power at the time of discharging the battery 10 by using $R_{int}$.

Figure 4:
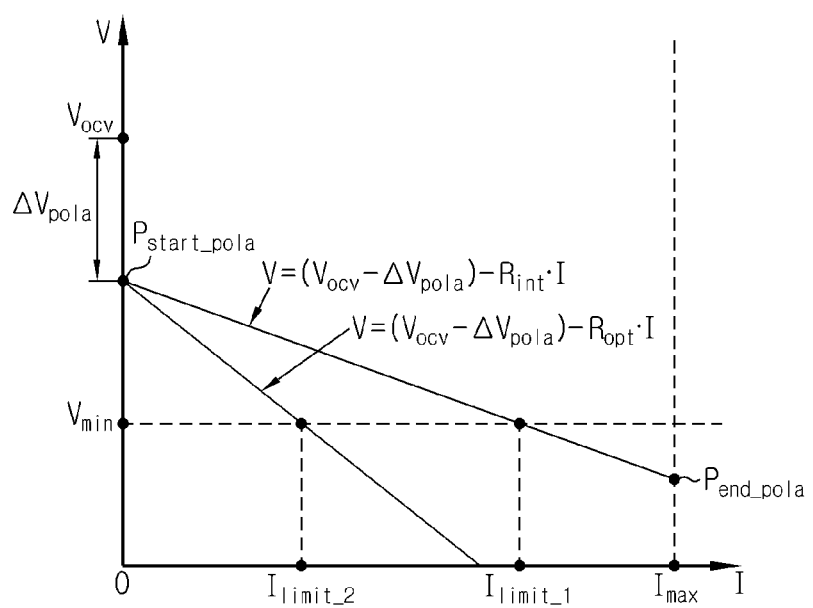
FIG. 4 is a graph referred to in describing a difference between a discharge limiting current determined based on the internal resistance described above with reference to FIGS. 2 and 3 and a discharge limiting current determined based on an optimum resistance.

FIG. 4 is a graph referred to in describing a difference between a discharge limiting current determined based on the internal resistance described above with reference to FIGS. 2 and 3 and a discharge limiting current determined based on the optimum resistance.

Referring to FIG. 4, a polarization voltage $\Delta V_{pola}$ may be generated in the battery 10 at a time point when the discharging current $I_{dis}$ is measured, according to a use state thereof. The control unit 130 can determine the polarization voltage $\Delta V_{pola}$ by using a known data fitting method such as a least square algorithm.

When the polarization voltage $\Delta V_{pola}$ is generated, the voltage-current characteristic profile 300 illustrated in FIG. 3 may be modified to be shifted by $\Delta V_{pola}$ along the V axis as illustrated in FIG. 4. Accordingly, the start point $P_{start}$ is shifted to $P_{start\_pola}$, and the end point $P_{end}$ d is shifted to $P_{end\_pola}$. In this case, $P_{start\_pola} = (V_{ocv} - \Delta V_{pola}, 0)$ and $P_{end\_pola} = (V_{end} - \Delta V_{pola}, I_{max})$. Although not separately illustrated, the intermediate points $P_{inter\_1}$, $P_{inter\_2}$, and $P_{inter\_3}$ in FIG. 3 are also shifted by $\Delta V_{pola}$ along the V axis.

In order to reflect the polarization voltage $\Delta V_{pola}$, Equation 1 may be changed to Equation 14 below and Equation 11 may be changed to Equation 15 below.

$$V = (V_{ocv} - \Delta V_{pola}) - R_{int}I \qquad \text{<Equation 14>}$$

$$V = (V_{ocv} - \Delta V_{pola}) - R_{opt}I \qquad \text{<Equation 15>}$$

In order to prevent the over-discharge of the battery 10, it is preferable to determine the discharge limiting current for the battery 10 in consideration of the polarization voltage $\Delta V_{pola}$.

A discharge limiting current based on the internal resistance $R_{int}$ may be determined by using Equation 16 below related to Equation 14.

$$I_{limit\_1} = \frac{(V_{ocv} - \Delta V_{pola}) - V_{min}}{R_{int}} \qquad \text{< Equation 16 >}$$

On the other hand, the control unit 130 may determine a discharge limiting current $I_{limit\_2}$ based on the optimum resistance $R_{opt}$ by using Equation 17 below related to Equation 15.

$$I_{limit\_2} = \frac{(V_{ocv} - \Delta V_{pola}) - V_{min}}{R_{opt}} \qquad \text{< Equation 17 >}$$

Since $R_{opt}$ is larger than $R_{int}$, $I_{limit\_2}$ is smaller than $I_{limit\_1}$. Therefore, when $I_{limit\_2}$ instead of $I_{limit\_1}$ is determined as the discharge limiting current of the battery 10, the amount of voltage drop of the battery 10 is reduced by the magnitude corresponding to $(I_{limit\_1} - I_{limit\_2})$, thereby effectively preventing the over-discharge of the battery 10.

The control unit 130 may adjust a duty cycle of the switching signal output to the switch 20 so that a discharging current exceeding the determined discharge limiting current $I_{limit\_2}$ does not flow.

The above-described embodiments of the present disclosure are not implemented only by the devices and methods and may be implemented by the program for realizing the functions corresponding to the configuration of the embodiments of the present disclosure or the recording medium having recorded thereon the program. These implementations can be easily achieved by those skilled in the art from the description of the embodiments described above.

While the present disclosure has been shown and described with reference to certain preferred embodiments thereof, but the present disclosure is not limited thereto. It should be understood by those skilled in the art that various changes and modifications can be made without departing from the spirit of the present disclosure as defined by the appended claims and their equivalents.

In addition, it should be understood by those skilled in the art that since various changes and modifications can be made without departing from the spirit of the present disclosure, the present disclosure is not limited to the above-described embodiments and the accompanying drawings, and all or some of the embodiments may be selectively combined so that various modifications can be made.

What is claimed is:

1. A battery management system for optimizing an internal resistance of a battery, the battery management system comprising:
   a current measurement unit configured to measure a discharging current of the battery;
   a memory configured to store a plurality of voltage-current characteristic profiles; and
   a control unit operatively connected to the current measurement unit and the memory, the control unit being configured to:
      determine a reference profile from the plurality of voltage-current characteristic profiles based on a state of charge and a temperature of the battery, the reference profile including a start point, an end point, and a plurality of intermediate points positioned between the start point and the end point;
      determine an internal resistance of the battery by dividing a difference between a voltage of the start point and a voltage of the end point by a current of the end point;
      set one of the plurality of intermediate points as a reference point;
      determine a reference resistance smaller than the internal resistance based on the reference point and the end point; and
      determine an optimum resistance larger than the internal resistance based on the discharging current, the internal resistance, the reference resistance, and a predetermined discharge upper limit current,
      wherein the voltage of the start point indicates an open circuit voltage of the battery corresponding to the state of charge and the temperature of the battery.

2. The battery management system of claim 1, wherein the current of the end point is equal to the discharge upper limit current.

3. The battery management system of claim 1, wherein the control unit is further configured to determine the reference resistance based on a voltage of the reference point, a current of the reference point, a voltage of the end point, and a current of the end point.

4. The battery management system of claim 3, wherein the control unit is further configured to determine the reference resistance using Equation 1:

$$R_{ref} = \frac{V_{ref} - V_{end}}{I_{ref} - I_{end}},$$

where:
$I_{ref}$ is the current of the reference point,
$V_{ref}$ is the voltage of the reference point,
$I_{end}$ is the current of the end point,
$V_{end}$ is the voltage of the end point, and
$R_{ref}$ is the reference resistance.

5. The battery management system of claim 4, wherein the control unit is further configured to determine the optimum resistance using Equation 2:

$$R_{opt} = \frac{V_{ocv} - \{V_{ocv} - (R_{int} - R_{ref})I_{end} - R_{ref}I_{dis}\}}{I_{dis}} = \frac{(R_{int} - R_{ref})I_{end}}{I_{dis}} + R_{ref},$$

where:
$R_{int}$ is the internal resistance,
$I_{dis}$ is the discharging current, and
$R_{opt}$ is the optimum resistance.

6. The battery management system of claim 1, wherein the control unit is further configured to determine, as the reference point, an intermediate point closest to the end point among the plurality of intermediate points.

7. A battery pack comprising the battery management system of claim 1.

8. A method of optimizing an internal resistance of a battery, the method comprising:
   determining a reference profile from a plurality of voltage-current characteristic profiles based on a state of charge and a temperature of the battery, the reference profile including a start point, an end point, and a plurality of intermediate points positioned between the start point and the end point;
   determining an internal resistance of the battery by dividing a difference between a voltage of the start point and a voltage of the end point by a current of the end point;
   setting one of the plurality of intermediate points as a reference point;
   determining a reference resistance smaller than the internal resistance based on the reference point and the end point; and
   determining an optimum resistance larger than the internal resistance based on a discharging current, the internal resistance, the reference resistance, and a predetermined discharge upper limit current of the battery,
   wherein the voltage of the start point indicates an open circuit voltage of the battery corresponding to the state of charge and the temperature of the battery.

* * * * *